United States Patent [19]

Heath et al.

[11] Patent Number: 4,497,973
[45] Date of Patent: Feb. 5, 1985

[54] THERMOELECTRIC DEVICE EXHIBITING DECREASED STRESS

[75] Inventors: Donald L. Heath, Leonard; Der-Jeou Chou, Sterling Heights, both of Mich.

[73] Assignee: ECD-ANR Energy Conversion Company, Troy, Mich.

[21] Appl. No.: 470,154

[22] Filed: Feb. 28, 1983

[51] Int. Cl.³ ............................................. H01L 35/28
[52] U.S. Cl. .................................. 136/212; 136/205; 136/225
[58] Field of Search ........................ 136/205, 212, 225

[56] References Cited

U.S. PATENT DOCUMENTS

| | | | |
|---|---|---|---|
| 3,859,143 | 1/1975 | Krebs | 136/205 |
| 4,097,308 | 6/1978 | Klein et al. | 206/445 X |
| 4,204,882 | 5/1980 | Howell | 136/221 X |
| 4,420,790 | 12/1983 | Golke et al. | 73/718 X |

Primary Examiner—Leland A. Sebastian
Attorney, Agent, or Firm—Lawrence G. Norris

[57] ABSTRACT

A thermoelectric device exhibiting both structural integrity and decreased stress across the device notwithstanding the application of thermally cycled temperature differentials thereacross includes, electrically interconnected thermoelectric elements and a rigidly affixed substrate. Thermal stress is relieved by using flexible conductors to interconnect the thermoelectric elements, and by the use of a flexile joint to attach a second substrate to the remainder of the device. Complete elimination of the second substrate may also be used to eliminate stress. Presence of the rigidly affixed substrate gives the device sufficient structural integrity to enable it to withstand rugged conditions.

15 Claims, 6 Drawing Figures

THERMOELECTRIC DEVICE EXHIBITING DECREASED STRESS

BACKGROUND

The present invention relates to new and improved thermoelectric devices for the generation of electricity.

It has been recognized that the world supply of fossil fuels for the production of energy is being exhausted at ever increasing rates. This realization has resulted in an energy crisis which impacts not only the world's economy, but threatens the peace and stability of the world. The solution to the energy crisis lies in the development of new fuels and more efficient techniques to utilize them. To that end, the present invention deals with energy conservation, power generation, pollution, and the generation of new business opportunities by the development of new thermoelectric devices which provide more electricity.

An important part of the solution with respect to the development of permanent, economical energy conversion lies in the field of thermoelectrics wherein electrical power is generated by heat. It has been estimated that more than two-thirds of all our energy, for example, from automobile exhausts or power plants, is wasted and given off to the environment. Up until now, there has been no serious climatic effect from this thermal pollution. However, it has been predicted that as the world's energy consumption increases, the effects of thermal pollution will ultimately lead to a partial melting of the polar ice caps with an attendant increase in sea level.

The efficiency of a thermoelectric device can be expressed in terms of a figure of merit (Z) for the material forming the device, the equation defining Z is:

$$Z = S^2 \sigma / K$$

where:

Z is expressed in units $\times 10^3$;
S is the Seebeck coefficient in $\mu V/°C$.;
K is the thermal conductivity in mW/cm—°C.; and
$\sigma$ is the electrical conductivity in $(\Omega\text{-cm})^{-1}$ From the above, one can see that in order for a material to be suitable for thermoelectric power conversion, it must have a large value for the thermoelectric power Seebeck coefficient (S), a high electrical conductivity ($\sigma$), and a low thermal conductivity (K). Further, there are two components to the thermal conductivity (K): $K_l$, the lattice component; and $K_e$, the electrical component. In non-metals, $K_l$ dominates and it is this component which mainly determines the value of K.

Stated in another way, in order for a material to be efficient for thermoelectric power conversion, it is important to allow carriers to diffuse easily from the hot junction to the cold junction while maintaining the temperature gradient. Hence, high electrical conductivity is required along with low thermal conductivity.

Thermoelectric power conversion has not found wide usage in the past. The major reason for this is that prior art thermoelectric materials which are at all suitable for commercial applications have been crystalline in structure. Crystalline solids cannot attain large values of electrical conductivity while maintaining low thermal conductivity. Most importantly, because of crystalline symmetry, thermal conductivity cannot be controlled by modification.

In the case of the conventional polycrystalline approach, the problems of single crystalline materials still dominate. However, new problems are also encountered by virtue of the polycrystalline grain boundaries which cause these materials to have relatively low electrical conductivities. In addition, the fabrication of these materials is also difficult to control as a result of their more complex crystalline structure. The chemical modification or doping of these materials, because of the above problems are especially difficult.

Among the best known currently existing polycrystalline thermoelectric materials are $(Bi,Sb)_2Te_3$, PbTe, and Si-Ge. The $(Bi,Sb)_2Te_3$ materials are best suited for applications in the $-10°$ C. to $150°$ C. range with their best Z appearing at around $30°$ C. $(Bi,Sb)_2Te_3$ represents a continuous solid solution system in which the relative amount of Bi and Sb are from 0 to 100%. The Si-Ge material is best suited for high temperature applications in the $600°$ C. to $1000°$ C. range with a satisfactory Z appearing at above $700°$ C. The PbTe polycrystalline material exhibits its best figure of merit in the $300°$ C. to $500°$ C. range. None of these materials are well suited for applications in the $100°$ C. to $300°$ C. range. This is indeed unfortunate, because it is in this temperature range where a wide variety of waste heat applications are found. Among such applications are geothermal waste heat and waste heat from internal combustion engines in, for example, trucks, buses, and automobiles. Applications of this kind are important because the heat is truly waste heat. Heat in the higher temperature ranges must be intentionally generated with other fuels and therefore is not truly waste heat.

New and improved thermoelectric alloy materials have been discovered for use in the aforesaid temperature ranges. These materials are disclosed and claimed in co-pending U.S. application Ser. No. 412,306, filed Aug. 27, 1982 in the names of Tumkur S. Jayadev and On Van Nguyen for New Multiphase Thermoelectric Alloys and Method of Making Same now U.S. Pat. No. 4,447,277 issued May 8, 1984 and U.S. application Ser. No. 414,917, filed Sept. 3, 1982 in the names of Tumkur S. Jayadev, On Van Nguyen, Jamie M. Reyes, Helen Davis and Michael W. Putty for New Powder Pressed Thermoelectric Materials and Method of Making Same, which patent and application are incorporated herein by reference.

The thermoelectric materials there disclosed can be utilized in the devices herein. These materials are not single phase crystalline materials, but instead, are disordered materials. Further, these materials are multiphase materials having both amorphous and multiple crystalline phases. Materials of this type are good thermal insulators. They include grain boundaries of various transitional phases varying in composition from the composition of matrix crystallites to the composition of the various phases in the grain boundary regions. The grain boundaries are highly disordered with the transitional phases including phases of high thermal resistivity to provide high resistance to thermal conduction. Contrary to conventional materials, the material is designed such that the grain boundaries define regions including conductive phases therein providing numerous electrical conduction paths through the bulk material for increasing electrical conductivity without substantially affecting the thermal conductivity. In essence, these materials have all of the advantages of polycrystalline materials in desirably low thermal conductivities and crystalline bulk Seebeck properties. However, unlike the conventional polycrystalline materials, these disordered multiphase materials also have desirably high electrical conductivities. Hence, as disclosed in the aforementioned referenced applications, the $S^2\sigma$ product for the figure of merit of these materials can be independently maximized with desirably low thermal conductivities for thermoelectric power generation.

Amorphous materials, representing the highest degree of disorder, have been made for thermoelectric applications. The materials and methods for making the same are fully disclosed and claimed, for example, in U.S. Pat. Nos. 4,177,473, 4,177,474, 4,178,415 which issued in the name of Stanford R. Ovshinksky. The materials disclosed in these patents are formed in a solid amorphous host matrix having structural configurations which have local rather than long-range order and electronic configurations which have an energy gap and an electrical activation energy. Added to the amorphous host matrix is a modifier material having orbitals which interact with the amorphous host matrix as well as themselves to form electronic states in the energy gap. This interaction substantially modifies the electronic configurations of the amorphous host matrix to substantially reduce the activation energy and hence, increase substantially the electrical conductivity of the material. The resulting electrical conductivity can be controlled by the amount of modifier material added to the host matrix. The amorphous host matrix is normally of intrinsic-like conduction and the modified material changes the same to extrinsic-like conduction.

As also disclosed therein, the amorphous host matrix can have lone-pairs having orbitals wherein the orbitals of the modifier material interact therewith to form the new electronic states in the energy gap. In another form, the host matrix can have primarily tetrahedral bonding wherein the modifier material is added primarily in a non-substitutional manner with its orbitals interacting with the host matrix. Both d and f band materials as well as boron and carbon, which add multiorbital possibilities can be used as modifiers to form the new electronic states in the energy gap.

As a result of the foregoing, these amorphous thermoelectric materials have substantially increased electrical conductivity. However, because they remain amorphous after modification, they retain their low thermal conductivities making them well suited for thermoelectric applications, especially in high temperature ranges above 400° C.

These materials are modified on an atomic or microscopic level with the atomic configurations thereof substantially changed to provide the above-mentioned independently increased electrical conductivities. In contrast, the materials disclosed in the aforementioned referenced applications are not atomically modified. Rather, they are fabricated in a manner which introduces disorder into the material on a macroscopic level. This disorder allows various phases including conductive phases to be introduced into the material much in the same manner as modification atomically in pure amorphous phase materials to provide controlled high electrical conductivity while the disorder in the other phases provides low thermal conductivity. These materials therefore are intermediate in terms of their thermal conductivity between amorphous and regular polycrystalline materials.

A thermoelectric device generates electricity by the establishment of a temperature differential across the materials contained therein. Thermoelectric devices generally include elements of both p-type and n-type material. In the p-type material the temperature differential drives positively charged carriers from the hot side to the cold side of the elements, while in the n-type material the temperature differential drives negatively charged carriers from the hot side to the cold side of the elements.

Thermoelectric power conversion has not found wide usage in the past not only because of material limitations but also because of device limitations. Among the device limitations are bowing or warping of device substrates, loss of broad surface contact between the device and a heat exchanger when utilized in a thermoelectric system, and temperature losses across the substrates.

Thermoelectric devices of the prior art use copper lead patterns placed upon a ceramic substrate for the attachment of thermoelectric elements thereto. In the manufacture of these devices, a second ceramic substrate having another copper lead pattern is sweated onto the thermoelectric elements. In the sweating process, a layer of solder or brazing alloy is applied to the members being joined, by methods such as stencilling a granular paste thereonto, and the assembly is heated to a temperature sufficient to fuse the solder or brazing alloy and thereby join the elements. Due to the difference in the coefficient of thermal expansion between the ceramic substrates and the copper lead patterns, there occurs a bowing or warping of the substrates during the sweating operation which causes a number of related problems.

First, because of the warping of the substrates, it is difficult, if not impossible, to obtain a good thermal connection between the elements and the copper lead patterns of the substrates. Additionally, because the ceramic substrates are brittle, the bowing or warping, if severe enough, can cause cracking of the substrates and other physical degradation of the devices. Furthermore, to be employed in a thermoelectric system, the outer surfaces of the substrates must make intimate broad surface contact with a heat exchanger. The warping or bowing of the substrates makes proper connection between the devices and a heat exchanger difficult.

To overcome these problems, the forces imparted to the substrates caused by the difference in the coefficients of thermal expansion between the copper lead patterns and the ceramic substrates are equalized by applying copper in substantially identical patterns as the lead patterns to the other side of the substrates. Unfortunately, the additional copper increases the material cost of the devices and adds extra processing steps to their manufacture. Furthermore, the degree of abatement of thermal stress obtained by this process is still not satisfactory.

During the operation of thermoelectric devices, a temperature differential is applied across the device to generate electricity. Due to the difference in the coefficient of thermal expansion between the substrates and the thermoelectric elements, loss of broad surface contact occurs between the device and the heat exchanger when utilized in a thermoelectric system. This loss of broad surface contact results in less heat transfer which translates to a lower temperature differential across the device, and lower efficiency of the device.

It has also been found that a substantial temperature drop occurs across the ceramic substrates. The voltage output and the current of the thermoelectric element is proportional to the temperature differential across the element. Therefore, the power is proportional to the square of the temperature differential, and any change in temperature differential across the elements has a substantial effect on the power output of the device. As a result, the temperature drop across the substrates reduces the temperature differential otherwise available to the elements for power generation. Further, the additional copper used to overcome the warping problems adds additional temperature losses across the substrates. These losses undesirably decrease the temperature differential across the thermoelectric elements from the temperature differential available across the devices thereby adversely decreasing the power output of the devices.

Because of these problems, thermoelectric devices of the prior art often failed during operation due to cracking of thermoelectric elements, loosening of electrical and thermal connections and fracture of the substrate. Furthermore, warpage and loss of broad surface contact results in lower heat transfer which translates into a lower temperature differential across the device and therefore, a lower overall efficiency.

In an attempt to overcome these problems, a substrateless device has been proposed. This device and method of fabrication thereof is disclosed and claimed in co-pending U.S. application Ser. No. 372,688 filed Apr. 28, 1982, now U.S. Pat. No. 4,459,428, in the name of Der-Jeou Chou for Improved Thermoelectric Device and Method of Making Same, which application is also incorporated herein by reference. The device disclosed therein has no substrates and no compensating elements. Consequently, thermal losses normally resulting from these components are eliminated. Futhermore, the disclosed device exhibits a lower degree of thermal stress because the thermoelectric generating elements are flexibly held together by a plurality of conductive interconnecting members and a potting compound filling the voids between the elements. This structure results in a device having a high degree of flexibility. Although the efficiency of this device is high, performance under many circumstances leaves much to be desired. Unfortunately, the interconnect members and the potting compound between the elements provide the device with only limited structural integrity and, consequently, it is not rugged enough under some circumstances to withstand mechanical vibration during handling, installation or use which of course limits the utility of this device.

There is, therefore, a need for a thermoelectric device which provides both structural reliability and high efficiency. More specifically, there is a need for a thermoelectric device which is capable of withstanding mechanical stresses resulting from its use in systems presenting a high degree of vibration or mechanical shock such as in internal combustion engines or the like; and which exhibits a low degree of thermal stress when a temperature gradient is applied thereto, thereby eliminating problems of damage and poor heat transfer, and which also exhibits decreased thermal losses, thereby fully exploiting the efficiencies of the new and improved thermoelectric materials previously mentioned and disclosed in U.S. Pat. No. 4,447,277 and U.S. Ser. No. 414,917. The thermoelectric devices of the instant invention satisfy these needs as will be described hereinafter; one device embodying the present invention includes one rigid substrate upon which the thermoelectric elements and their accompanying interconnect means are rigidly mounted, thereby providing a unitary, rugged structure. In addition, the device includes means for relieving thermal stress, so that substrate warpage and consequent poor heat transfer and device failure are eliminated. In addition, the presence of the stress relieving means obviates the need for the stress compensating copper bars of the prior art thereby eliminating the efficiency losses associated with such components. In accordance with another embodiment of the instant invention the other substrate can be eliminated completely thereby further decreasing thermal losses and increasing efficiencies.

As will be demonstrated hereinafter, the new and improved thermoelectric generating devices of the instant invention overcome the problems of the prior art. Mechanical strength is retained, while high efficiencies and power output are obtained as a result of efficient heat transfer and superior thermal contact due to the elimination of device warpage.

SUMMARY OF THE INVENTION

The present invention provides a new and improved thermoelectric device for the generation of electricity. The device exhibits both structural integrity and decreased stress across the device notwithstanding the application of thermally cycled temperature differentials across the device. The new thermoelectric device includes a plurality of thermoelectric generating elements, first and second coupling means on opposite respective sides of the thermoelectric elements for interconnecting the elements in accordance with a predetermined pattern, and a rigid substrate affixed to the first coupling means on the side thereof opposite the thermoelectric elements, and providing structural integrity to the device. The device also includes stress relieving means associated with the second coupling means which permits the thermoelectric elements, the substrate, and the coupling means to expand and contract responsive to thermal cycling of said device.

In one embodiment of this invention, the stress relieving means comprise one or more flexible electrically conductive members which serve as part of the means for electrically interconnecting the thermoelectric elements. In accordance with another embodiment, the thermal stress relieving means comprises a flexile, thermally-conductive joint connecting the second coupling means to a second rigid substrate. In yet another embodiment of the invention, the stress relieving means comprises an electrically insulating, thermally conducting layer upon the second electrical interconnect means. Use of this layer allows for the elimination of a second rigid substrate and thereby increases efficiency of heat transfer and eliminates thermal stress resulting from expansion and contraction of a second substrate.

The thermoelectric generating device of the present invention provides a high degree of resistance to thermally generated stress and therefore resists warpage which could damage the thermoelectric elements, or result in poor thermal contact of the device to a heat exchanger, and subsequent loss of efficiency. The presence of a rigidly affixed substrate insures durability of the device under severe operating conditions. The instant invention fulfills a long-felt need for a rugged reliable high-efficiency thermoelectric device which is not damaged or degraded by repeated thermal cycling.

DETAILED DESCRIPTION OF DRAWINGS

In accordance with the present invention, new and improved thermoelectric devices representing preferred embodiments of the present invention shall now be described with reference to the drawings.

Figure 1:
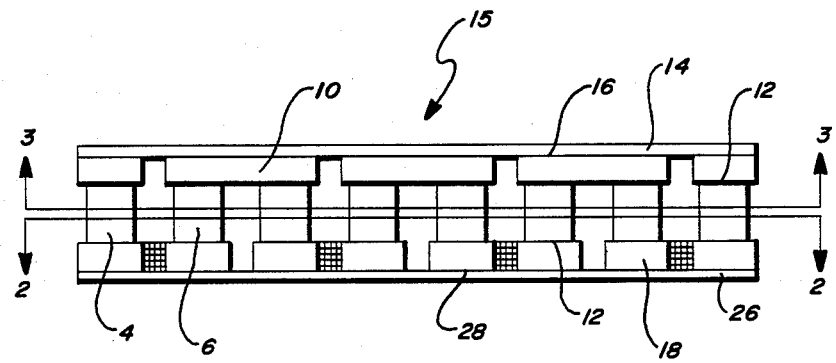
FIG. 1 is a side view of a thermoelectric device embodying the present invention.

Referring now to FIG. 1, there is illustrated a thermoelectric device 15 structured in accordance with the present invention. The device 15 includes a plurality of p-type and n-type thermoelectric elements 4 and 6 respectively, electrically interconnected by means of a first set of rigid electrical interconnects 10 and a second set of flexible electrical interconnects 18. The device 15 further includes two rigid, electrically-insulating substrates 14 and 26.

Figure 2:
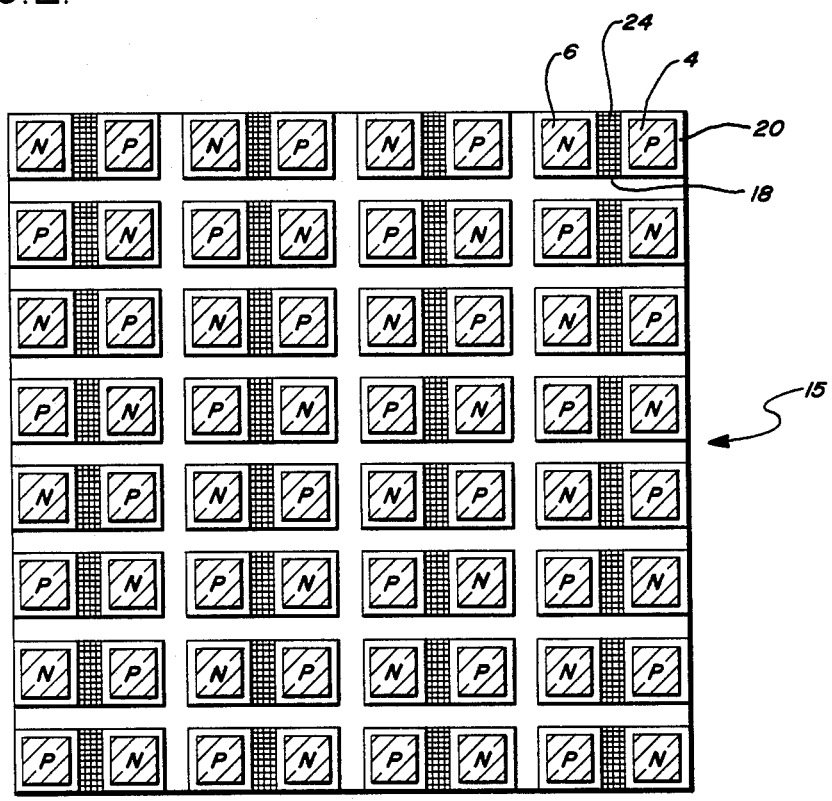
FIG. 2 is a cross-sectional view taken along lines 2—2 of FIG. 1.

The p-type elements 4 and the n-type elements 6 of the device 15 are equal in number and alternate throughout as is best shown in FIG. 2. It illustrates that the device 15 includes by way of example, 32 p-type elements 4 and 32 n-type elements 6, but any equal number of p-type and n-type elements will suffice. A representative composition utilized for the p-type elements 4 comprises from about 10–20% bismuth, about 20–30% antimony, about 60% tellurium, and less than 1% silver. The n-type elements may comprise about 40% bismuth, about 54% tellurium, and about 6% selenium. These materials and others usable as p-type and n-type elements are disclosed and claimed in the aforementioned co-pending U.S. application Ser. No. 412,306 filed Aug. 27, 1982, for New Multiphase Thermoelectric Alloys and Method for Making Same now U.S. Pat. No. 4,447,277 issued May 8, 1984, and U.S. application Ser. No. 414,917 filed Sept. 3, 1982, for New Powder Pressed Thermoelectric Material and Method of Making Same, which patent and application are incorporated herein by reference.

Referring again to FIG. 1, the p-type and n-type thermoelectric elements 4 and 6 are electrically interconnected in a series arrangement by a first and a second electrical interconnection means. The first interconnection means consists of a number of rigid electrical interconnect members 10 joining chosen pairs of thermoelectric elements together. Preferred materials for these interconnect members include metals such as copper, aluminum, silver and the like. These electrical interconnect members 10 are rigidly fixed to the thermoelectric elements 4 and 6 by means of a thermally and electrically conductive joint 12 therebetween. This joint may be made by the use of solder or conductive adhesives. In a production process, the interior surfaces of the interconnect members 10 may have a solder paste screen printed thereon for thermally and electrically connecting the elements thereto by sweat soldering.

The electrical interconnection of the thermoelectric elements 4 and 6 is completed in this embodiment of the invention by means of a plurality of flexible, electrically-conductive members 18 which will be described in further detail below. These flexible members electrically connect chosen pairs of the thermoelectric elements 4 and 6; and in cooperation with the rigid interconnect members 10, serve to link the thermoelectric elements of the device 15 in a predetermined pattern.

The arrangement of the p-type and n-type thermoelectric elements, and the flexible interconnect members 18 is illustrated in FIG. 2. Respective first pairs of the p-type thermoelectric elements 4 and n-type thermoelectric elements 6 are interconnected by means of the flexible interconnect member 18.

Figure 3:
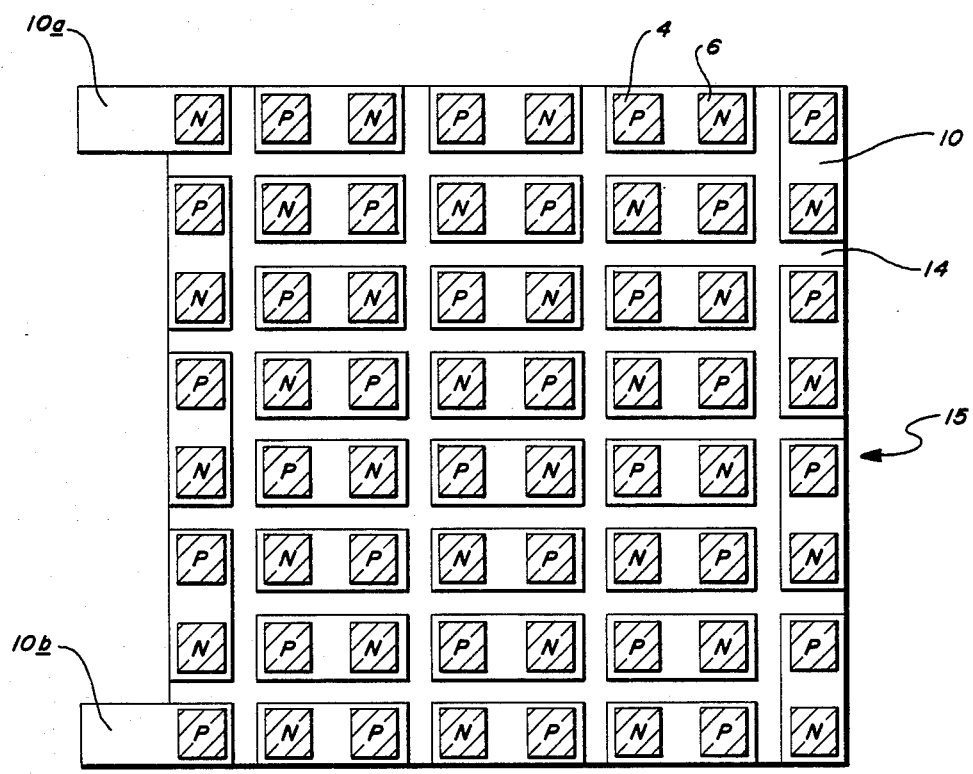
FIG. 3 is a cross-sectional view taken along lines 3—3 of FIG. 1.

Referring now to FIG. 3, illustrated is the disposition of the thermoelectric elements in relation to the rigid interconnect members 10. In this portion of the device 15, respective second pairs of the p-type thermoelectric elements 4 and the n-type thermoelectric element 6 are interconnected by the rigid interconnect members 10. As will be appreciated, when the flexible interconnect members 18 and the rigid interconnect members 10 are in juxtaposed position on opposite sides of the thermoelectric elements 4 and 6, a series type current path is established through the thermoelectric elements with the p-type and n-type elements alternating throughout. While the illustrated embodiment depicts such a series connection, it may be desirable in some circumstances to have the thermoelectric elements interconnected in a parallel arrangement or a mixed series-parallel arrangement, depending on the desired output voltage and current of the finished device.

Figure 4:
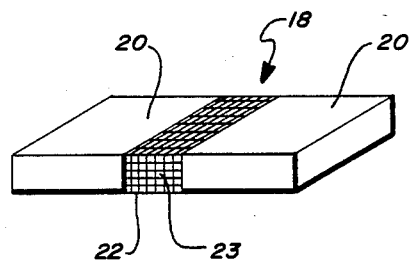
FIG. 4 is a perspective view of a flexible interconnect structured in accordance with one embodiment of the present invention.

Referring now to FIG. 4, it illustrates a flexible electrical interconnect 18 structured in accordance with one embodiment of the instant invention. The interconnect member 18 includes two rigid electrically conductive portions 20 joined by a flexible electrically conductive connector 22. For example, the rigid portions 20 can be two solid copper members and the flexible connector 22 can be a flat braided cable 23. In one embodiment, the cable 23 is attached to the solid copper members 20 by crimping one edge of each member 20 over the cable 23. In another embodiment, the cable 23 is soldered to the members 20.

Figure 5:
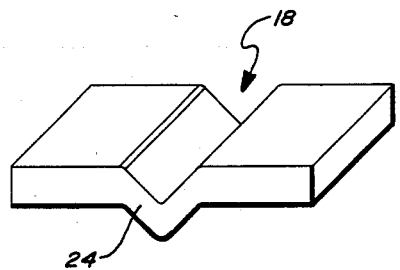
FIG. 5 is a perspective view of another flexible interconnect structured in accordance with a second embodiment of the present invention.

FIG. 5 illustrates still another flexible electrical interconnect member structured in accordance with this invention. The interconnect 18 of FIG. 5 consists of one piece of metal having a flexible, spring-like portion 24 formed in its central region. This flexible portion 24 may be formed by standard metal working techniques such as stamping, coining and heat treating.

In the thermoelectric device 15 shown in FIG. 1, the flexible electrical interconnects 18 are joined to the thermoelectric elements 4 and 6 by means of a thermally and electrically conductive joint generally similar to that used to join the rigid interconnect members 10 to the thermoelectric elements. Solder is one material useful in forming this joint 12. The solder may be applied to the individual elements so as to form each joint separately, or a batch sweat-soldering process may be employed using a solder paste, whereby a plurality of joints 12 may be formed simultaneously. Thermally and electrically conductive adhesives are one alternative to solder that may be used for this joint 12.

In order to provide electrical isolation of the thermoelectric elements 4 and 6 from the external environment and mechanical strength, the thermoelectric device 15 shown in FIG. 1 also includes two substrate plates 14 and 26. The first plate 14 is rigidly affixed to the rigid interconnect members 10 on the side thereof opposite that which is attached to the thermoelectric elements.

This substrate plate 14 provides electrical isolation of the thermoelectric device elements 4 and 6 from the external environment thereby preventing short circuiting of the device. The rigidly attached substrate 14 additionally provides mechanical durability for the resulting thermoelectric device 15. It is desired that this substrate 14 be an electrical insulator, a good heat conductor and durable. Ceramics, such as alumina, for example, exhibit such properties and can be used to form the substrate. Other materials which can also be used to form the substrate include metals having an insulating coating upon at least one surface thereof. For example, the substrate may be formed from a sheet of aluminum having a layer of aluminum oxide thereon.

To provide mechanical rigidity of the thermoelectric device 15, and as previously mentioned, the first substrate 14 is rigidly affixed to the rigid interconnect members 10. This can be achieved by a strong thermally-conductive joint 16 formed by a solder or adhesive. In accordance with one embodiment of the invention, the substrate 14 can have metallized regions thereon formed by techniques such as vacuum deposition, electro-less plating, screen printing or the like. Solder joints are then formed between these metallized regions and the rigid interconnect members 10. While not illustrated in FIG. 1; the compensating bars utilized in prior art devices may be attached to the surface of the first substrate 14 opposite the surface upon which the rigid interconnect members 10 are attached. Use of compensating bars will result in additional stress relief, although heat transfer will be impeded somewhat.

The second substrate plate 26 of the thermoelectric device 15 is attached to the flexible interconnect members 18 on the side thereof opposite the thermoelectric elements 4 and 6, by means of a flexile joint 28. This flexile joint 28 maintains the substrate plate 26 in good thermal contact with the flexible interconnect members 18 while allowing for expansion and contraction of the device 15 in response to thermal cycling thereof. This is referred to as a "floating substrate". It is desirable that this flexile joint 28 be a good conductor of heat and also have sufficient mobility to allow the interconnect members to slide across the substrate 26, and thereby relieve thermal stress. Such a flexile joint may be made by the use of a thin film of a thermally conductive grease such as "Thermo-Duct #574" manufactured by AREMCO.

In operation, the thermoelectric device 15 generates electricity when a temperature differential is established between the two substrate plates 14 and 26, thereby driving flux through the thermoelectric elements 4 and 6. In the n-type elements 6, the temperature differential drives negative carriers from the hot side to the cold side and in the p-type element 4, the temperature differential drives positive carriers from the hot side to the cold side. It is this movement of the positive and negative carriers which generates electricity in a device of this type. Electrical current flows in series through the p-type elements of this device 15, as previously described, and may be withdrawn from the device terminals formed by rigid interconnect extensions 10a and 10b as shown in FIG. 3.

Applying a thermal gradient across any thermoelectric device generates strains and warpages in the device due to the different expansion rates of the device components. In the device 15 of FIG. 1, these stresses and strains are absorbed and relieved by the flexible interconnect members 18 and the floating substrate 26. This results in a device having a very low tendency to warp under operating conditions, which is therefore better able to maintain good thermal contact with a heat exchanger. Relief of thermally generated stress also prevents the device 15 from being damaged by these stresses thereby providing a device exhibiting high reliability.

While the device 15 depicted in FIG. 1 shows the use of flexible interconnect members and a floating substrate to give a thermoelectric device exhibiting low thermal stress, it is not necessary to use the two elements of the invention in conjunction. That is to say, flexible electrical interconnects may be employed in a device having two rigidly mounted substrates, or a floating substrate may be used in a device having all rigid interconnects. While it is advantageous to use both of these means to reduce thermal stress, in some applications one or the other will suffice.

Figure 6:
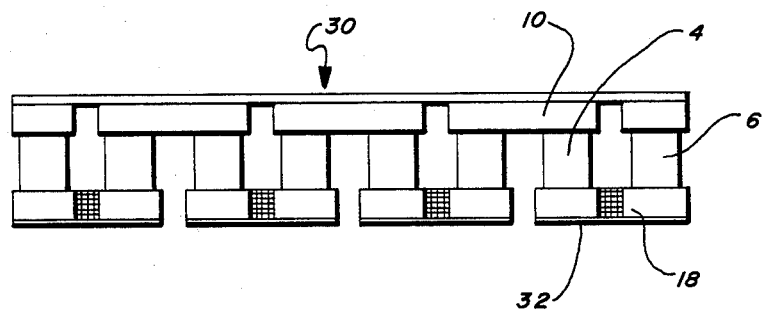
FIG. 6 is a side view of another thermoelectric device structured in accordance with another embodiment of the present invention.

FIG. 6 depicts another thermoelectric device 30 embodying the present invention. The device 30 is generally similar to the device 15 of FIG. 1. As a result, corrresponding components share corresponding reference numerals. The device 30 includes p-type 4 and n-type 6 thermoelectric elements joined in a predetermined interconnected pattern. These elements 4 and 6 are rigidly attached to rigid interconnect members 10 which are in turn rigidly attached to a substrate 14. As in the device in FIG. 1, flexible electrical interconnect members 18 are employed as the second interconnect means. These flexible interconnect members 18 are generally identical to those of the device of FIG. 1 and are attached by similar methods. The point at which the device of FIG. 4 differs from that of FIG. 1, is in the complete elimination of the second substrate plate 26. Because the substrate 26 is eliminated, electrical isolation of the flexible interconnects 18 from the external environment is provided in accordance with this embodiment of the present invention, by a layer 32 of electrically insulating thermally conducting material deposited upon the surface of the flexible interconnects 18 opposite the surface thereof upon which the thermoelectric elements are bonded. This layer 32 allows thermal energy to pass through to the elements 4 and 6, but provides electrical isolation.

The insulating material 32 can be applied to the flexible interconnect members either before or after their attachment to the thermoelectric elements 4 and 6 and the insulating material can be, for example, formed of a thick film ceramic paste such as ESL M4906 manufactured by Electro-Science Laboratories, Inc. of Pennsauken, N.J. or the like. The thick film ceramic is applied to the interconnects, dried at 125° C. for 15 minutes and then fired for 30 minutes at 900° C. to form an insulating layer. Instead of the ceramic, high temperature organic polymers such as polyphenylene or organo-silicon compounds can also be used to form the insulating layer 32. Still another preferred method of forming the insulating layer 32 would involve the deposition of an electrically-insulating, thermally-conductive compound upon the flexible interconnect 18 by vacuum deposition techniques such as sputtering, evaporation, chemical vapor deposition, or the like. Materials such as boron nitride, silicon nitride, silicon oxide, or the like may thus be deposited to form the layer. In accordance with still another preferred embodiment, the insulating layer 32 can be formed directly upon the flexible interconnect 18 by techniques such as anodization. If the flexible interconnect 18 were fabricated from aluminum, anodization would produce a tough, highly adherent, electrically-insulating, thermally-conductive coating of alumina.

The thermoelectric generator 30 of FIG. 6 provides mechanical stability and durability due to the presence of a rigid substrate 14 having the elements of the generator rigidly attached thereonto. The device 30 also provides for relief of thermally generated stress through the use of the flexible electrical interconnect members 18. This device further provides increased efficiency due to the elimination of the second substrate plate and consequent elimination of the thermal losses which would otherwise result across this plate. As for the device 15 of FIG. 1, the device 30 of FIG. 6 may additionally include the compensating bars employed in prior art devices, without departing from the spirit of the invention.

It may be desirable in some cases to encapsulate the thermoelectric device with a potting compound. The potting compound should exhibit the qualities of high thermal resistivity, and high electrical resistivity to thereby further increase the reliability and efficiency of the devices. The potting compound is used to fill in the spaces between the thermoelectric generating elements, the interconnect members, and the substrate or substrates of the devices. The potting compound electrically and thermally isolates the thermoelectric elements and also protects them from damage due to thermal stresses and mechanical strains. Among the preferred materials for potting these devices is a ceramic compound sold under the name of AREMCO #554. Organo-silicon compounds or thermally stable polymers are also desirable potting compounds.

It can be seen from the foregoing that the instant invention provides thermoelectric devices which provide high efficiencies along with a high degree of ruggedness and reliability. The use of a rigid substrate and rigid mounting of the elements thereon results in a sturdy device able to resist mechanical trauma while the incorporation of stress relieving means such as flexible interconnects and a floating substrate relieves thermally generated stresses which can cause poor heat transfer or even destroy the device. Elimination of the second substrate results in improved heat transfer as well as stress relief and consequently gives improved device efficiency.

Modification and variations of the present invention are possible in light of the above teachings. It is, therefore, to be understood that within the scope of the appended claims, the invention may be practiced otherwise than as specifically described.

What we claim is:

1. A new and improved thermoelectric device providing both structural integrity and relief of stress across the device, notwithstanding the application of thermally cycled temperature differentials across said device, said device comprising:
   a. a plurality of thermoelectric elements;
   b. first and second electrical coupling means on opposite respective sides of said thermoelectric elements for interconnecting said elements electrically in accordance with a predetermined pattern;
   c. a first rigid substrate afixed to said first coupling means on the side thereof opposite said thermoelectric elements, to provide structural integrity, and;
   d. flexile stress relieving means associated with said second electrical coupling means, for permitting said elements, said substrate, and said coupling means to expand and contract responsive to thermal cycling of said device.

2. A thermoelectric device as defined in claim 1, wherein said thermoelectric elements are interconnected in a series pattern.

3. A thermoelectric device as defined in claim 1, wherein said thermoelectric elements are interconnected in a parallel arrangement.

4. A thermoelectric device as defined in claim 1, wherein said thermoelectric elements are connected in a mixed series parallel arrangement.

5. A thermoelectric device as defined in claim 1, further including a second rigid substrate on the side of said elements opposite said first rigid substrate and wherein said stress relieving means includes a flexile joint joining said second coupling means to said second rigid substrate on the side thereof opposite said thermoelectric elements.

6. A thermoelectric device as defined in claim 5, wherein said flexile joint comprises a thin layer of thermally conductive grease applied between said second coupling means and said second substrate.

7. A thermoelectric device as defined in claim 1, wherein said stress relieving means includes at least one flexible electrically conductive member.

8. A thermoelectric device as defined in claim 7, wherein said flexible electrically conductive member comprises:
   a. two rigid metal plates, each adapted to be joined to one of said thermoelectric elements, and;
   b. a flexible electrically conductive cable joining said plates.

9. A thermoelectric device as defined in claim 7, wherein said flexible electrically conductive member comprises a solid metallic member having a thin flexible central portion.

10. A thermoelectric device as defined in claim 1, wherein said second coupling means includes a plurality of electrically conductive members each of said conductive members interconnecting respective pairs of said thermoelectric elements and an electrically insulating coating upon each of said conductive members on the side thereof opposite said thermoelectric elements.

11. A thermoelectric device as defined in claim 10, wherein said electrically insulating coating comprises a ceramic material.

12. A thermoelectric device as defined in claim 10 wherein said electrically insulating coating is chosen from the group consisting of oxides of aluminum, germanium, zirconium and silicon.

13. A thermoelectric device as defined in claim 10, wherein said electrically conductive members are flexible.

14. A thermoelectric device as defined in claim 10, wherein said electrically conductive members are made of aluminum and said electrically insulating coating is an oxide of aluminum.

15. A new and improved thermoelectric device providing both structural integrity and relief of stress across the device notwithstanding the application of thermally cycled temperature differentials across said device, said device comprising:
   a. a plurality of thermoelectric elements;
   b. first electrical coupling means rigidly connected to a first side of said thermoelectric elements;
   c. a rigid substrate affixed to said first coupling means on the side thereof opposite said thermoelectric elements, to provide structural integrity;

d. a plurality of flexible electrically conductive members, each of said members being electrically connected to chosen pairs of said thermoelectric elements, on a side thereof opposite said first coupling means, said flexible members cooperating with said first coupling means to electrically interconnect said thermoelectric elements in a predetermined pattern and also serving to relieve thermal stress; and e. a second substrate affixed to said flexible members on a side thereof opposite said thermoelectric elements by a thin layer of thermally conductive grease.

* * * * *